United States Patent [19]

Randazzo et al.

[11] Patent Number: 5,493,142
[45] Date of Patent: Feb. 20, 1996

[54] INPUT/OUTPUT TRANSISTORS WITH OPTIMIZED ESD PROTECTION

[75] Inventors: Todd A. Randazzo, Colorado Springs; Bradley J. Larsen, Woodland Park, both of Colo.; Geoffrey S. Gongwer, Campbell, Calif.

[73] Assignee: Atmel Corporation, San Jose, Calif.

[21] Appl. No.: 397,584

[22] Filed: Mar. 2, 1995

Related U.S. Application Data

[63] Continuation-in-part of Ser. No. 180,716, Jan. 12, 1994, abandoned.

[51] Int. Cl.$^6$ ..................................... H01L 29/76
[52] U.S. Cl. .................. 257/328; 257/336; 257/344; 257/408
[58] Field of Search ....................... 257/328, 336, 257/344, 408

[56] References Cited

U.S. PATENT DOCUMENTS

| | | | |
|---|---|---|---|
| 4,692,781 | 9/1987 | Rountree et al. | 357/23.13 |
| 4,855,620 | 8/1989 | Duvvury et al. | 307/448 |
| 4,933,730 | 6/1990 | Shirato | 257/328 |
| 5,146,298 | 9/1992 | Eklund | 257/328 |
| 5,278,441 | 1/1994 | Kang et al. | 257/371 |

*Primary Examiner*—Edward Wojciechowicz
*Attorney, Agent, or Firm*—Schneck & McHugh

[57] ABSTRACT

An apparatus providing electrostatic discharge (ESD) protection in an input/output transistor. Disposed near the gate and the surface of the substrate is a lightly doped region. A sidewall oxide layer is selectively etched to extend laterally from a gate a significant amount. The sidewall oxide layer is also etched on an opposite side of the gate and may laterally extend an appreciable amount in that direction. A heavily doped source and drain are implanted in the substrate at areas of the surface exposed by etching, the drain separated from the gate by the significant extent of sidewall oxide. Near the surface of the substrate, the drain is separated from the gate by a similar extent of the lightly doped region, which provides a resistance in series between the drain and gate for ESD protection. The source may also be separated from the gate by a lightly doped region of appreciable extent, which acts as a series resistance between the source and the gate to mitigate ESD. The extent of the sidewall oxide, and thus the lightly doped regions separating the gate from the drain and source, can be tailored to optimize ESD protection and performance characteristics for a given application by defocusing snapback conduction.

24 Claims, 7 Drawing Sheets

INPUT/OUTPUT TRANSISTORS WITH OPTIMIZED ESD PROTECTION

CROSS-REFERENCE TO RELATED APPLICATION

This application is a continuation-in-part of U.S. application Ser. No. 08/180,716, filed Jan. 12, 1994, now abandoned.

TECHNICAL FIELD

The present invention involves semiconductor integrated circuits having improved electrostatic discharge immunity.

BACKGROUND ART

Electrostatic discharge (ESD) is a known cause of failure in metal oxide semiconductor field effect transistors (MOSFETs). In ESD, a relatively large pulse of current which has been acquired from external factors, such as triboelectric charging of a package, flows unintendedly through elements of an integrated circuit (IC) chip. The elements that initially encounter an ESD pulse are typically input and/or output buffers that are directly connected to bond pads or terminals which may be exposed to external events such as an ESD pulse. Such buffers, which are typically relatively large transistors, may be damaged by an ESD pulse, or smaller internal transistors on a chip may be damaged. The current pulse can flow into a transistor from the gate, the drain or the source, although the source is typically connected to a power supply and is unlikely to supply an ESD pulse. An ESD pulse supplied to the transistor through the gate will break down a dielectric gate oxide barrier between the gate and the channel, which may lead to permanent damage by leaving a conductive path of ionized dielectric or trapped electrons, or by burning a hole in the gate oxide.

An ESD current pulse originating at the drain may flow to either the substrate, the gate or the source. Any of these flows may similarly cause permanent damage to the gate oxide. Even if the ESD pulse, which may be several thousand volts, does not flow directly from the drain to the gate, an electronic ripple from this pulse may destroy the gate oxide layer, which may break down at 20 volts or less. The destruction of the gate oxide renders the circuit, chip, and often the device containing the chip dysfunctional.

To improve the speed and other performance characteristics of MOSFETs, especially in response to problems such as parasitic resistances that occur with submicron devices, the formation of silicide layers at the surfaces of sources, gates and drains is commonly employed. These conductive layers of metal and silicon, termed "salicide" when self-aligned, further aggravate the ESD problem, by reducing resistances that had formerly protected the circuit from ESD. In addition, as described in U.S. Pat. No. 4,855,620 to Duvvury et al., the metal of these silicided areas can be melted by heat generated by an ESD event, and flow along electric field lines to cause permanent short circuiting of the device. Similarly, the lightly doped drain (LDD) structure, used to reduce the peak drain electric field of near-micron and submicron N-channel transistors, and in some cases to minimize short channel effects in P-channel transistors, also has been reported to increase vulnerability to ESD.

Several methods for improving the ESD immunity of advanced MOSFET and complementary metal-oxide-silicon (CMOS) devices have been proposed. One approach is to add an additional output protection circuit to protect against ESD, as taught by Duvvury et al. Similarly, in U.S. Pat. No. 4,692,781, Rountree et al. disclose an input protection circuit and an output protection circuit which are added to a transistor for ESD immunity.

Instead of adding circuits, the addition of a large space between the drain metal contact and the gate edge has been proposed as a means to add resistance in series with the drain of the output transistor. In a silicided structure, however, the amount of resistance added is minimal, as is the effect on ESD. "Silicide-blanking" allows the creation of silicon and polysilicon resistors from the source and drain by patterning where the silicidation occurs and does not occur. Lowering the doping and therefore increasing the impedance of the source and drain is another approach to preventing ESD, but is constrained by the degree to which drain and source concentrations can be lowered before affecting device performance. Finally, re-engineering the drain for higher electric fields and lower snapback voltage have been proposed, but this runs counter to the requirements for stable, short channel transistors.

An object of the present invention is to provide a transistor structure that is protected from ESD without an additional circuit or layer of material.

Another object of this invention is to provide a method for making such a transistor that is not appreciably more complicated than prior art methods for making less protected transistors.

SUMMARY OF THE INVENTION

The present invention protects an integrated circuit chip from ESD events by adding a series resistance between a source and drain of input or output transistors connected to bond pads of the chip. The series resistance is designed to raise the voltage of a localized current path between the source and drain above a trigger voltage at which snapback conduction across the channel initiates. By raising the voltage of this path above the trigger voltage, snapback conduction is induced in adjacent paths. Thus, instead of snapback conduction being focused along a localized path between the source and drain, which typically burns a hole along the path that destroys the transistor and renders the chip worthless, snapback conduction is encouraged to spread across the channel width, which is designed to be large enough to absorb an ESD pulse without damage.

This series resistance is formed by lightly doping a substrate masked by a gate and then forming and selectively etching an oxide layer covering the gate, source and drain of the transistor during manufacture such that a sidewall oxide spacer is extended outward from the gate toward the drain a measured amount. Another sidewall oxide spacer may be extended outward from the gate toward the source. The selective etching of that oxide layer exposes the surface of the substrate at ends of the sidewall oxides distal to the gate, allowing the formation of source and drain regions and contacts thereto. A lightly doped region of the substrate is left under the extended sidewall oxide, providing a resistance in series between the drain and the channel and, optionally, another resistance in series between the source and the channel. These measured resistances prevent or mitigate electrostatic discharge damage.

The selectively etched sidewall oxide provides a surface covering not possible with conventional, anisotropically etched sidewall oxide spacers, which are limited in extent to small masses nestled in corners between the gate region and the substrate. The self-aligned source and drain regions of the present invention are formed after the selective sidewall etching has been performed and are separated from the gate region by about the length of the selectively etched sidewalls, rather than the short, substantially fixed distance of the spacers of the prior art. It is also possible via the present invention to eliminate having an extended sidewall oxide spacer where it is not necessary for ESD protection, such as adjacent to the source in some circuits, while providing an extended sidewall oxide layer adjacent to the drain which can improve the performance and ESD protection of the transistor. The prior art techniques of anisotropic etching and silicide blanking do not allow for this improvement.

The selectively etched sidewall oxides do not require the extra layer of oxide used in silicide blanking, nor do they require the extra processing steps used to form that layer. Moreover, since source and drain doping occurs prior to the blanking in that technology, the heavily doped regions are still separated from the gate region by only the extent of the spacer oxides. Also, the extent of the blanking over those heavily doped and highly conductive regions known in the prior art must be large to achieve sufficient resistance, causing the transistor to be undesirably large. In contrast, the lightly doped region of the present invention is more resistive, and can therefore be made smaller in lateral extent. This results in improved current spreading in a smaller area. Since input/output transistors may each have a width of several hundred microns and several hundred of those transistors may exist on a chip, the space savings of the present invention over the prior art blanking is substantial.

BEST MODE FOR CARRYING OUT THE INVENTION

Figure 1A:
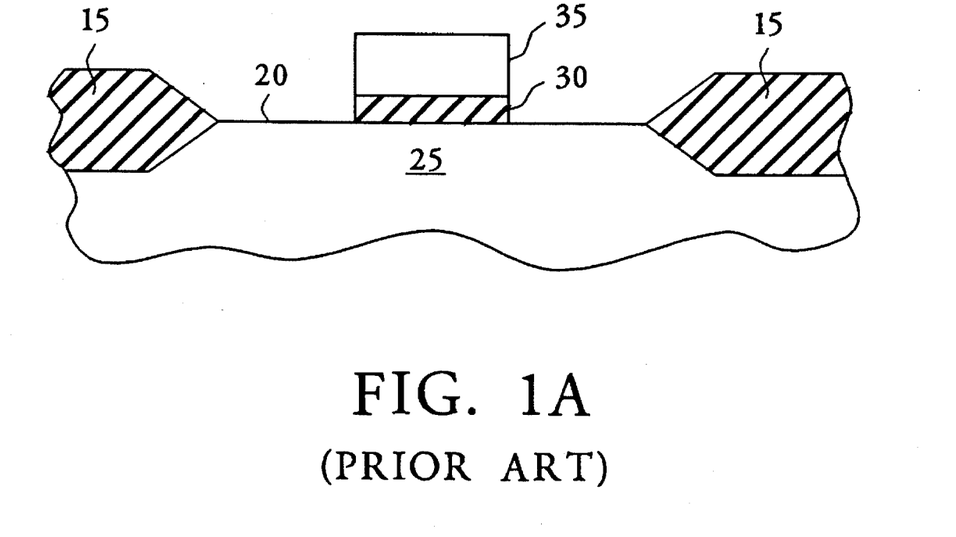
FIGS. 1A–1D are cross-sectional views of a prior art sequence for forming an output MOSFET.

Referring first to FIG. 1A, a prior art formation of a MOSFET N-channel (NMOS) input or output transistor begins with the formation of rows of field oxide (FOX) 15 at a surface 20 of a substrate 25. The substrate 25 is typically a P-type silicon (Si) wafer for N-channel devices such as this example, and the FOX 15 is formed of silicon dioxide ($SiO_2$) which is grown into and onto the surface 20. Disposed between the rows of FOX 15 is a dielectric layer of $SiO_2$ 30 which has been grown and is covered by a polysilicon gate 35. The insulative layer 30 separating the gate 35 from the surface 20 is known as the gate oxide 30.

Figure 1B:
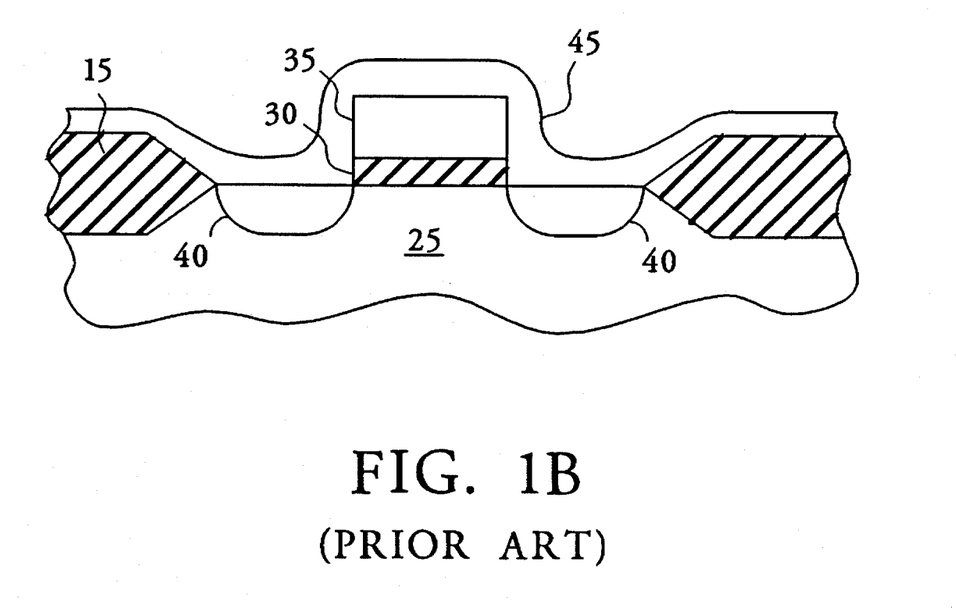

FIG. 1B shows the formation of N-type lightly doped drain regions 40 within the substrate 25 between the polysilicon gate 35 and the FOX 15 rows. A blanket oxide layer 45 is subsequently formed which covers the FOX 15, surface 20, gate oxide 30 and gate 35.

Figure 1C:
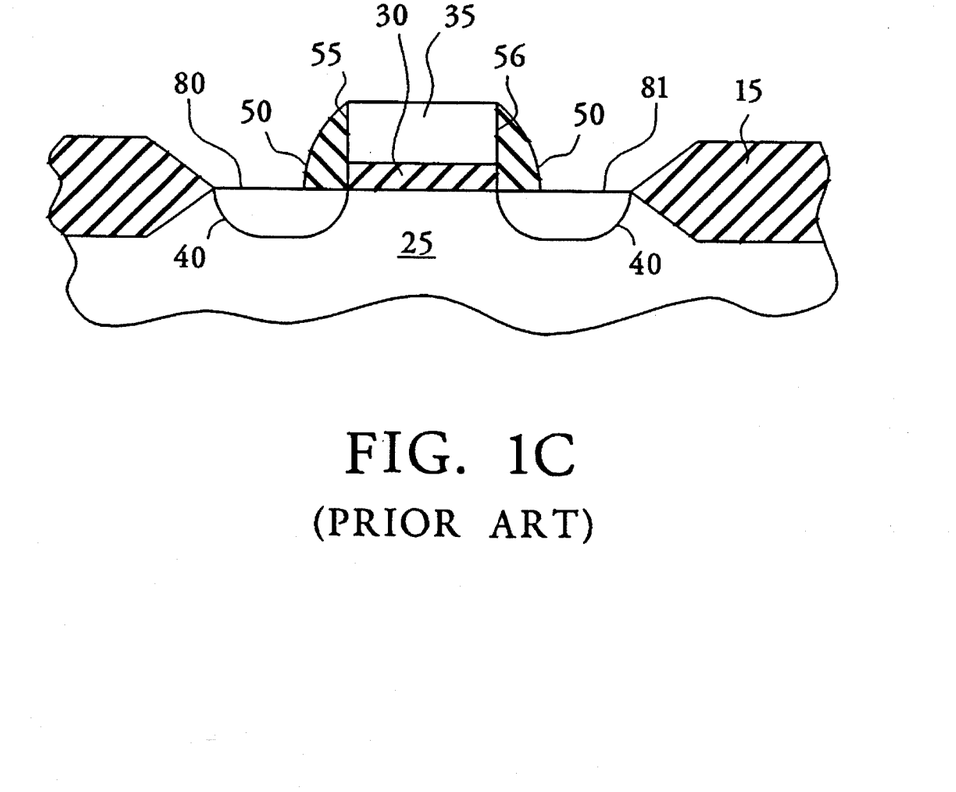
Figure 2:
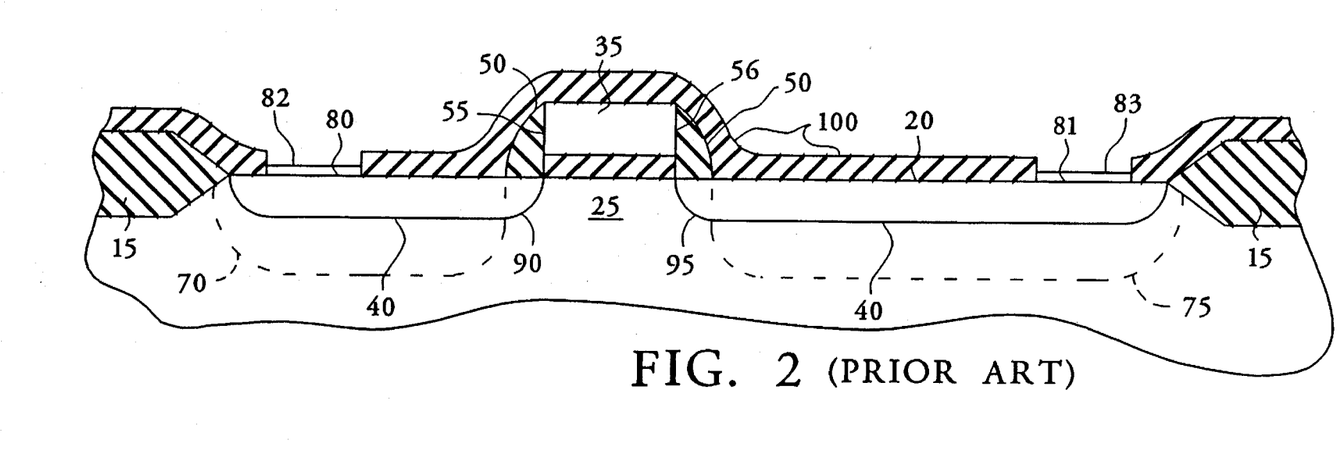
FIG. 2 is a cross-sectional view of an output MOSFET formed by a prior art process of silicide blanking.

FIG. 1C shows the result of an anisotropic blanket etch of the prior art on the structure of FIG. 2. Small sidewall oxide spacers 50 are left covering edges 55 and 56 of the polysilicon gate 35 and oxide layer 30. These spacers 50 remain after a controlled period of anisotropic etching due to the greater thickness of the oxide layer 45 at steps where the surface 20 and the edges 55 and 56 meet, while the etching exposes areas 80 and 81.

Figure 1D:
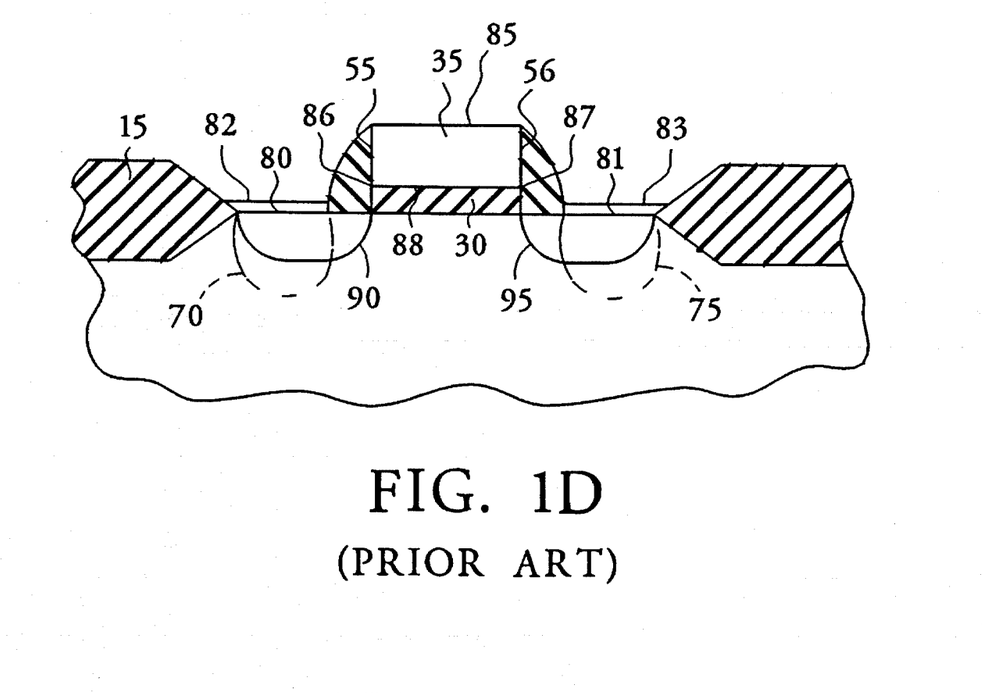

FIG. 1D shows the result of implantation into the substrate 25 of self-aligned, heavily doped N+ regions to form a source 70 and a drain 75. Exposed areas 80 and 81 of the surface 20 are then heated and exposed to a refractory metal to anneal the implanted substrate 25 and to form silicide at the exposed areas 80 and 81. A silicide area 82 thus adjoins the source 70 and another silicide area 83 adjoins the drain 75. A top 85 of the gate 35 may also be coated with silicide or may be coated with an oxide layer, not shown. Conventional processes are then followed to connect the top 85 of the gate 30 and silicide areas 82 and 83 of the source 70 and drain 75 with external circuitry. The external circuitry may include a bond pad, not shown, which can provide an ESD event that destroys the dielectric gate oxide 30. Due to the conductivity of the gate 35, ESD damage occurs most frequently near corners 86 and 87 located at intersections of a bottom 88 of the gate 35 and, respectively, edges 55 and 56.

The small spacers 50 of the prior art serve two purposes. The first is to spatially separate the source-drain regions which are exposed for silicidation 82 and 83 from the sidewalls of the gate electrode 55 and 56. Without these spacers, silicide would form over the sidewalls of the gate electrode 55 and 56 and provide a conductive path to the silicided regions 82 and 83, rendering the device inoperable. The incorporation of silicided source-drains is intended to increase the performance of advanced MOS technologies by minimizing the parasitic resistances of the source-drain regions. The second purpose of the sidewall spacers 50 is to provide a self-aligned mask for the formation of the heavily doped source-drain regions 70 and 75, thus allowing the formation of lightly doped drain regions 90 and 95. These lightly doped drain regions reduce the peak electric field at the drain of the device for a given applied voltage by terminating the drain potential less abruptly. This reduction in peak electric field reduces the generation of hot carriers in the channel, thus improving the short channel reliability and stability of the device.

While the prior art incorporation of sidewall spacers 50 has been helpful for the reasons listed above, it has been harmful from the standpoint of ESD sensitivity. The silicide areas 82 and 83 have shunted passive resistors 70 and 75 which previously provided some protection to the device from an ESD event, and the small LDD resistance in regions 90 and 95 has not been enough the make up for it. In addition, an ESD event can melt the metal in the silicided areas 82 and 83, which then flow along field lines caused by the event and directed between the source 70 and drain 75, increasing the conductance along those field lines. This unstable dispersion of power from an ESD event can lead to permanent metal filaments connecting the source 70 and drain 75 or holes burned through the substrate 25.

FIG. 2 shows a structure similar to that of FIG. 1, but with the additional steps and additional material used in silicide blanking. An oxide layer 100 covers the FOX 15, gate 35, spacers 50 and surface 20 of the substrate 25 aside from the exposed areas 80 and 81 which are subsequently formed into silicide. The areas 80 and 81 are etched from the oxide layer 100 with conventional photolithography and etching so that silicide can be formed in those areas. The heavily doped drain 75 can be seen to extend much further along the surface 20 in order to add resistance for ESD protection between the silicide 83 over the drain 75 and the edge 56 of the gate 35. As before, portions 90 and 95 of lightly doped regions 40 also add series resistance. The relatively large distance between the gate 35 and drain silicide 83 is required by the high conductivity of the heavily doped drain 75, which necessitates a large distance to achieve sufficient resistance for ESD immunity. Source silicide 82 is shown closer to the gate 35 than drain silicide 83, as less ESD protection may be needed adjacent source silicide 82.

Figure 3:
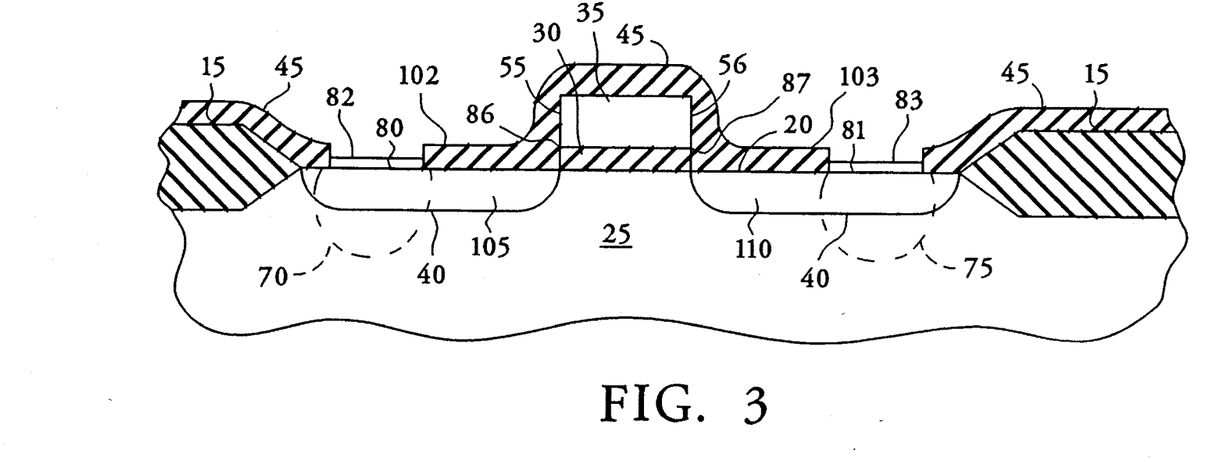
FIG. 3 is a cross-sectional view of a first output buffer embodiment of the present invention, having extended sidewall oxide layers and lightly doped regions.

Referring now to FIG. 3, a first embodiment of an input or output transistor of the present invention is shown to include FOX rows 15 formed at a surface 20 of a silicon substrate 25, a gate oxide 30 and gate 35 are formed as described above under the prior art. Relatively extensive lightly doped drains 40 are formed between the gate oxide 30 and the FOX 15. A blanket dielectric oxide layer 45 is formed on top of the FOX 15, the surface 20, the gate oxide 30 and the gate 35, again as known in the prior art. The oxide layer is then masked and selectively etched to expose areas 80 and 81 of the surface 20 for silicide. The selective etching of the oxide 45 allows the formation of layers 102 and 103 which extend laterally further from the gate 35 and gate oxide 30 than the oxide spacers 50 of FIG. 1 created by the anisotropic etching of the prior art.

For convenience and economy, the selective etching of the present invention is performed by first patterning a mask to cover areas of the oxide 45 that are desired to be left intact, such as the areas to form oxide layers 102 and 103 and to expose areas of the oxide 45 to be removed, such as those for silicided areas 80 and 81. A standard dry spacer oxide etch is then performed so that normal sidewall spaces are formed elsewhere on the circuit where ESD protection is not required, such as the die interior to the input/output devices. It should be noted that other electrically insulative materials could be used in place of the oxide layer 45 provided that selective etching of those materials is possible.

Heavily doped regions, formed preferably by ion implantation, are then created in the substrate 25 via the areas 80 and 81 exposed by selective etching. In this manner a source 70 and drain 75 are formed. The substrate is then annealed to correct possible damage to the crystalline substrate 25 caused by the ion implantation, and then silicide is formed at the exposed areas 80 and 81. As before, silicide area 82 adjoins the source 70 and silicide area 83 adjoins the drain 75.

The length of the oxide layer 102 between the gate oxide 30 and the silicided area 82 can be seen to control the length of a portion 105 of the lightly doped region 40 that functions as a series resistor between the corner 86 and the silicide area 82 over the source 70. Similarly, the length of the oxide layer 103 between the edge 56 and the silicide area 83 can be seen to control the length of a portion 110 of the lightly doped region 40 that functions as a series resistor between the corner 87 and the silicide area 83 over the drain. Thus the total resistance provided by the portions 105 and 110 is adjustable by a masked dimension of the sidewall oxide 45. The symmetrical lightly doped regions 105 and 110 of this embodiment may be preferred for bidirectional transistors and may have a channel length of 0.3 microns to 6 microns. As will be discussed below, the exact length of the lightly doped regions 105 and 110 can be tailored to provide an optimized ESD protection structure.

The appreciable extent of lightly doped regions 105 and 110 acts to prevent ESD damage also by dispersing the path of an ESD current. Without these lightly doped regions 105 and 110, the shortest electrical path between any combination of the source 70, the gate 35 and the drain 75 is along the surface 20. The highly conductive silicided surface areas 82 and 83 also tend to concentrate current along the surface 20. A greater concentration of current during an ESD event will tend to increase the damage caused by that event. Lightly doped regions 105 and 110 tend to disperse the current away from the surface 20, increasing the tolerance to ESD.

It should be noted that the substrate 25 could be N-type silicon, the source 70 and drain 75 could be doped P+ and the lightly doped drains 40 doped with similarly charged ions to instead form a P-channel transistor (PMOS). Most likely, a complimentary of N-channel and P-channel device (CMOS) is to be formed. A conventional CMOS process flow is then followed. The lightly doped implants 40 and heavily doped regions 70 and 75 can be doped earlier in the formative steps outlined above, instead of or in addition to the self-aligned doping described above.

Comparison of FIG. 3 with FIG. 1 shows some of the advantages of the present invention. The lightly doped regions 105 and 110 of the present invention can extend further than the portions 90 and 95 of the prior art, as the sidewall oxide layers 102 and 103 of the present invention can extend further than the spacers 50 of the prior art. Due to the anisotropic etching employed in the prior art, the maximum lateral extent of the spacers 50 of the prior art was effectively limited to the lesser of a thickness of oxide layer 45 or a height of the top 85 of the gate 35 from the surface 20. The appreciable extent of lightly doped region 105 forms a larger series resistance between the source 70 and the gate 35 than provided by portion 90. Similarly, the significant extent of lightly doped region 110 forms a larger series resistance between the gate 35 and the drain 75 than that of portion 95, providing improved protection against ESD.

Comparison of FIG. 3 with FIG. 2 shows additional advantages of the present invention. The lightly doped region 110 may, despite its smaller size than region 40 of FIG. 2, provide more resistance than the larger distance between the corner 87 and silicide surface 80 over the drain 75 provided by silicon blanking. This is due to the higher unit resistance of the lightly doped region 110 than that of the heavily doped drain 75 of the silicide blanked structure. In addition, the silicide blanked structure can require more vertical space and material, as well as extra horizontal space and material, compared with the present invention. The silicide blanking also adds at least one extra processing step over that required for the present invention, due to the formation of blanking oxide 100. Thus, the silicon blanking shown in FIG. 2, although providing increased ESD protection over that provided by spacer oxides 50 of FIG. 1, may provide less ESD protection and require more space and material than the present invention.

Figure 4:
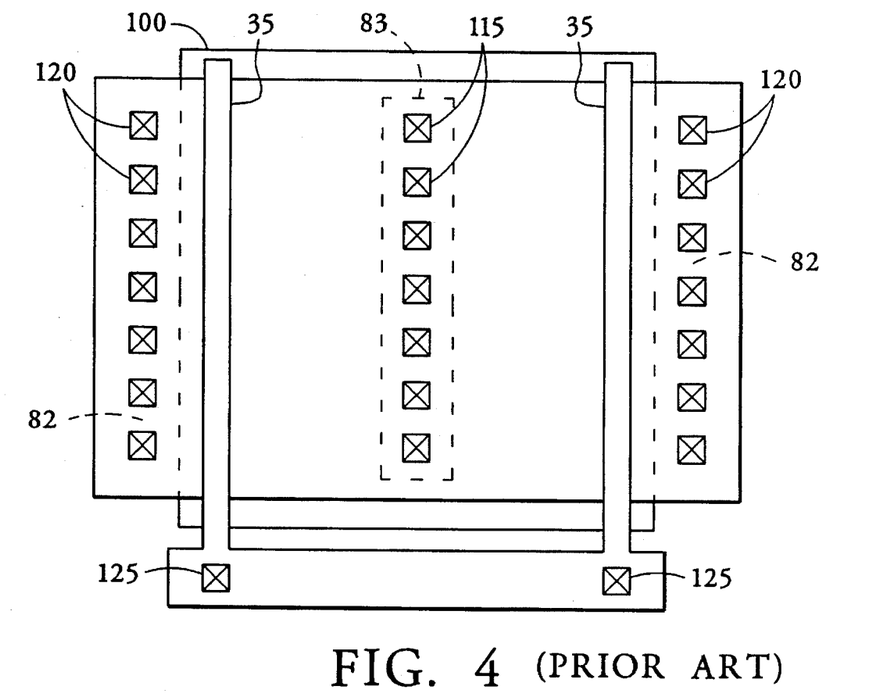
FIG. 4 is a top view of a prior art output MOSFET of FIG. 2.

Referring now to FIG. 4, the large separation between a drain contact 115 and a gate 35 for the prior art devices formed by the silicide blanking oxide layer 100 of FIG. 2 can be seen in this view of a top of an output transistor. As noted before, the large separation required by this technology is due to the relatively high conductivity of the drain region 40 underlying most of the space between the gate 35 and the drain silicide 83. Source contacts 120, gate contacts 125 and source silicided region 82 are shown for reference.

Figure 5:
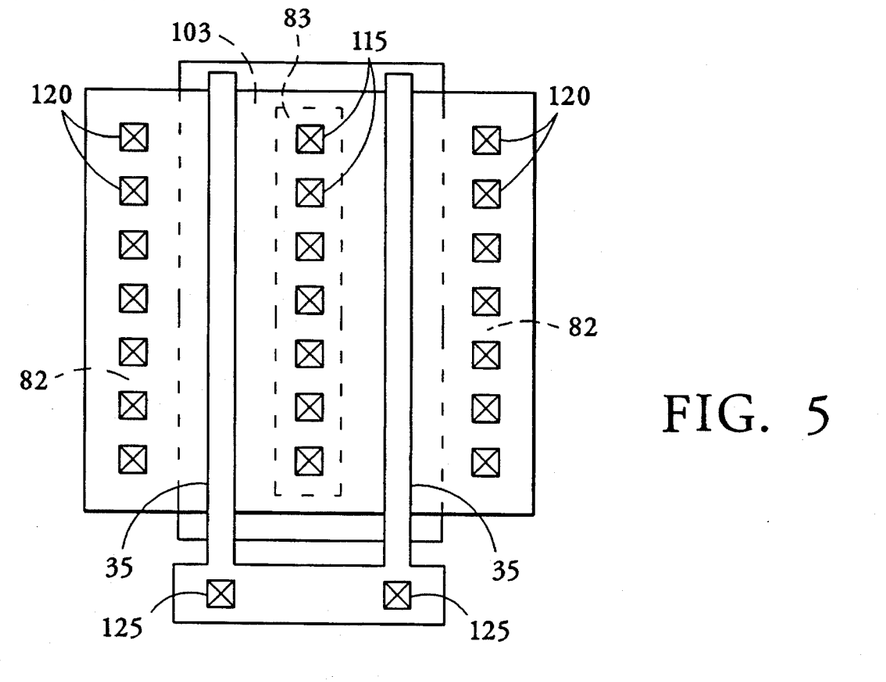
FIG. 5 is a top view of an output buffer of the embodiment shown in FIG. 3.

In comparison, a portion of a top of an output transistor made by the present technology can be seen in FIG. 5 to have a much smaller separation between drain contacts 115 and gate 35. As such, smaller input/output transistors can be used on an IC while achieving a higher ESD immunity using the present invention.

Figure 6:
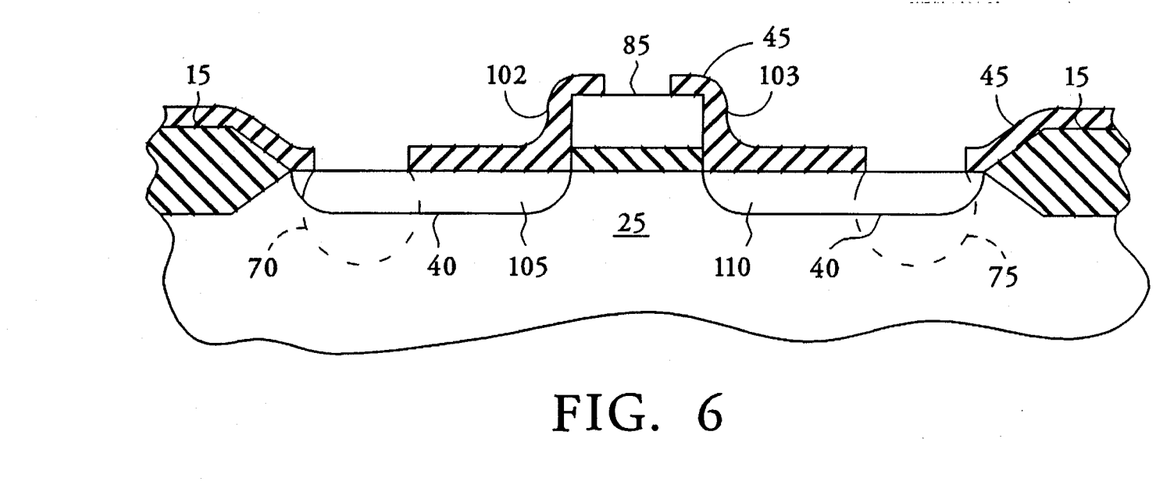
FIG. 6 is a second embodiment of an output buffer of the present invention, having an gate exposed for silicidation.

FIG. 6 shows a second embodiment of the present invention, in which the top 85 of the gate has also been exposed by selective etching. This allows silicidation of the top 85, for subsequent metallization and interconnection with other circuitry, not shown. The numbers shown in FIG. 6 refer to the same parts as corresponding numbers in previous FIGS. In general, the structure shown in FIG. 6 is used where it is desirable for the gate 35 to have a low resistance due to the silicide formation on it.

The controllable length of oxide layers 102 and 103 can be used to tailor the extension of lightly doped regions 105 and 110, in concert with the doping concentration of regions 105 and 110, for optimal device performance and ESD immunity. For a typical N-channel MOSFET, the length of lightly doped region 110 may be desired to be larger than that of lightly doped region 105. This may also be advantageous in avoiding hot carrier effects, which can destroy a gate oxide in a manner similar to but less dramatically than an ESD event.

Figure 7:
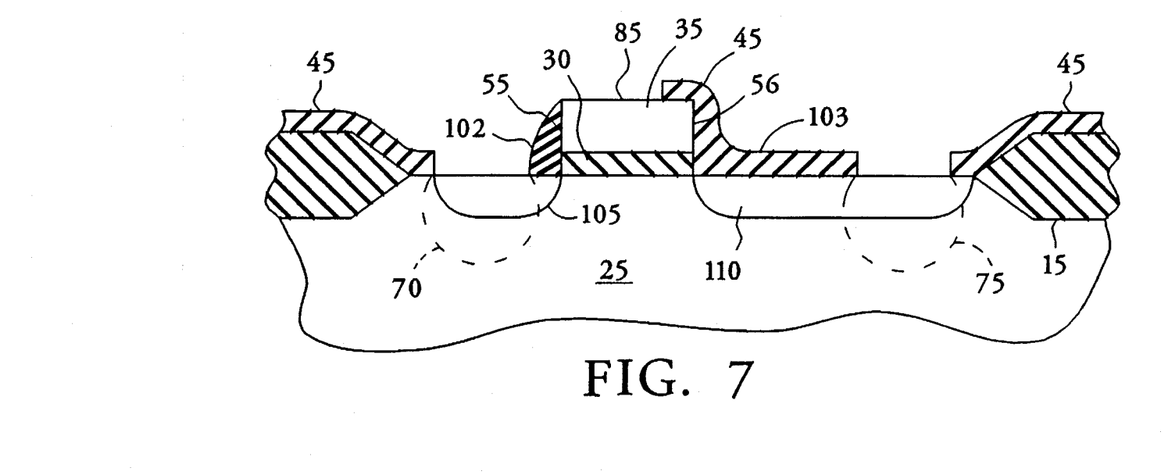
FIG. 7 is a third embodiment of the present invention, showing the gate exposed for silicidation and having an oxide layer extending on only one side.

FIG. 7 depicts another embodiment of the present invention, in which the selective etching of the oxide layer 45 has left a sidewall oxide layer 103 between the edge 56 of the polysilicon gate 35 and the drain 75, which results in a lightly doped drain region 110 between the gate 35 and the drain 75 of significant extent. Most of the top 85 of the gate 35 has been exposed by etching, to enable subsequent silicide formation on the gate 35. A standard sidewall oxide spacer 102 has been left between the edge 55 of the gate oxide 30 and the source 70 to prevent silicide formation from source to gate. This has been accomplished in this embodiment by exposing a portion of the source 70 and the gate 35 to the spacer etch with conventional photo masking. This forms a sidewall oxide spacer 102 on the source side in a similar manner as used for sidewall spacers of the prior art. This oxide spacer 102 minimizes the resistance between the source 70 and the gate 35 provided by lightly doped source region 105 for improved circuit performance in those circuits which do not require ESD protection between the source 70 and the gate 35.

The optimal extent of the sidewall oxide layers 102 and 103, and the resultant series resistance provided by lightly doped source and drain regions 102 and 103 involves a tradeoff between ESD protection and performance needs, as greater ESD protection typically entails more extensive series resistance, while improved circuit performance typically requires less series resistance. As such, the present invention also allows a means of optimizing the performance and ESD mitigation of a circuit by tailoring the length of the selectively etched sidewall layers to achieve an optimal series resistance. For example, for a typical transistor used as an output buffer, ESD protection near the drain is more essential, and the sidewall oxide layer 103 can be more extensive than layer 102 in order to increase the resistance provided by lightly doped drain region 110, as shown in FIGS. 5 and 6. On the other hand, a bidirectional transistor may benefit from equal ESD protection in series between the gate and both the source and drain, as shown by the substantially equal extent of lightly doped regions 105 and 110 shown in FIGS. 3 and 6.

Input/output transistors commonly have channel lengths, which are measured as the distance between the source and drain, that are much smaller than channel widths, which are measured in the direction that polysilicon gates 35 of FIG. 5 extend, for example. The reason for this small length to width aspect ratio is to allow fast, high-powered transistor action for communication with circuits external to the IC chip or for overcoming loads encountered internally on the chip. This large channel width, which may be several hundred microns (compared to a channel length of about one micron) may be used to absorb an ESD pulse through bipolar snapback conduction across the channel. However, testing performed during the present invention revealed that increases in channel width had a minor effect on lowering the voltage at which snapback conduction occurred, termed the "trigger voltage." The reason for this was found to be that snapback conduction, once triggered, typically occurs along a localized path through which the conduction originated, causing the total current from an ESD pulse to flow through that path, rather than utilizing the large channel width for current flow.

Figure 8:
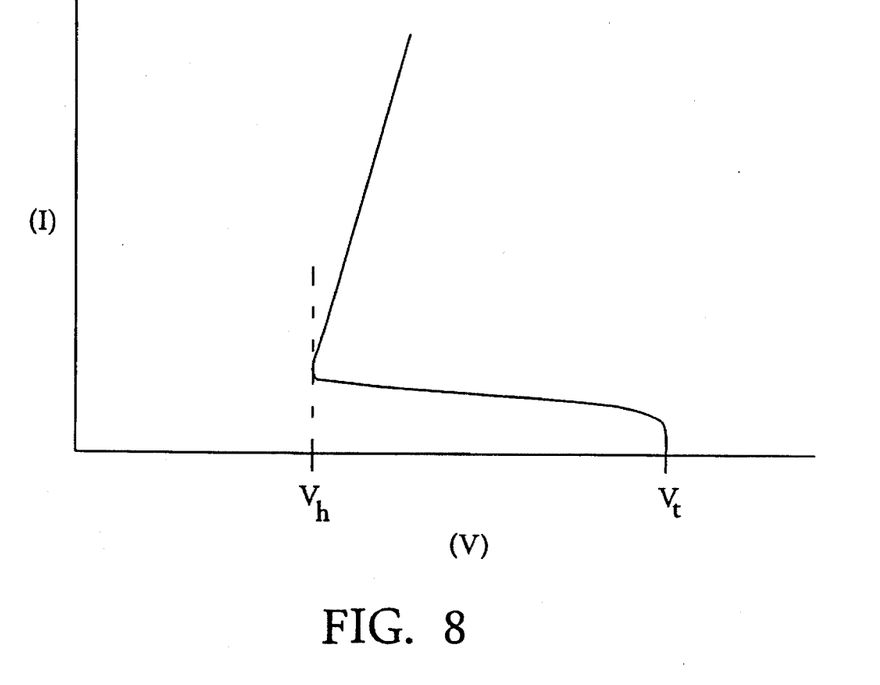
FIG. 8 is a graph of voltage versus current for a MOSFET device undergoing bipolar snapback conduction.

Referring now to FIG. 8, a current (I) versus voltage (V) graph for a transistor in snapback conduction shows that no current flows through the device between source and drain until the voltage has reached the trigger voltage ($V_t$). Once snapback conduction has initiated, the current increases and the voltage between the source and drain decreases. As long as the voltage is maintained above a holding voltage $V_H$, snapback current continues to flow. Increases in voltage above $V_H$ after snapback conduction has occurred provide large increases in current, as shown by the steep upward slope of the graph above the inflection point at $V_H$.

In order to utilize snapback conduction to absorb an ESD pulse without concentrating that pulse and burning a hole in the channel, the present invention adds a series resistance due to a lightly doped region such as region 110 of FIG. 3. This series resistance is selected to be sufficient to add a voltage due to the flow of current through the path in which snapback has been initiated that raises the voltage of that path above the trigger voltage ($V_t$), causing adjacent paths to be at or above $V_t$ and to also begin snapback conduction. This spreading of snapback conduction across the width and depth of the channel defocuses the snapback current from a single, concentrated path to a wide swath that may extend the width and depth of the channel.

To avoid damage to the channel, the spreading of current must occur before the current in a path has exceeded a maximum nondestructive current density ($I_m$), which can be empirically determined by testing similar devices. For immunity to an ESD event the area of the channel through which snapback current flows due to current spreading must be greater than the current from the ESD event divided by $I_m$. Stated differently, $I_m$ integrated over the area of the channel transverse to the current flow must be greater than the electrostatic discharge current. The ESD current can be estimated using known ESD parameters, such as a Human Body Model voltage of 2500 V, and an intrinsic resistance between a person and a bond pad of perhaps 1500 Ω. Other ESD failsafe criteria, such as the Machine Model or other parameters selected for a particular application, may instead be employed.

Figure 9:
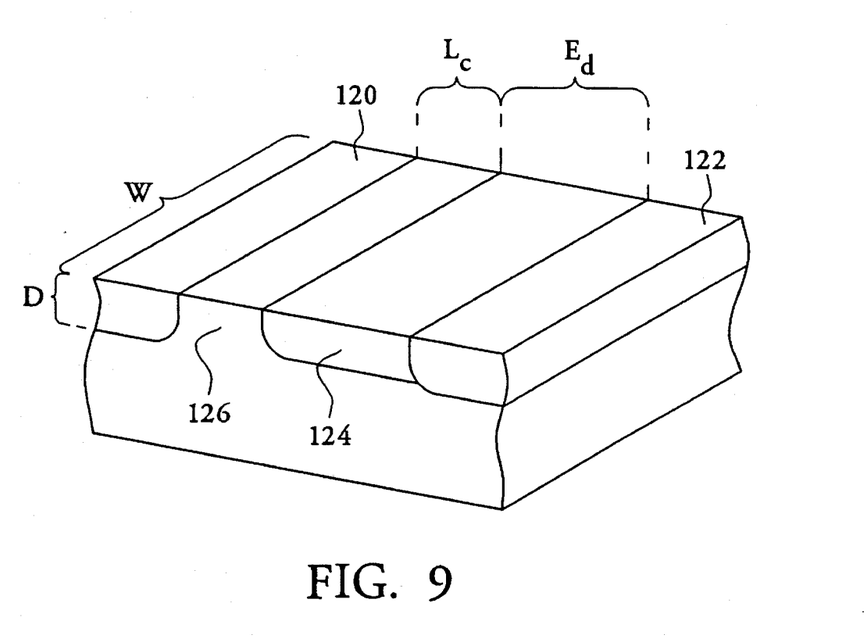
FIG. 9 is a cutaway perspective view of an ESD protection structure.

Referring now to FIG. 9, a perspective diagram of doped sections of a semiconductor substrate that form an ESD protection structure of the current invention are shown to include a source 120 and drain 122 which are heavily doped and a lightly doped drain extension 124, with an opposite conductivity type channel 126 disposed between the extension 124 and the source 120. The channel 126 has a length ($L_c$) separating the source 120 and the extension 124, a width (W) and depth (D) oriented transversely to that length ($L_c$). The drain extension 124 has a similar length and width as the channel 126, the extension having an extent ($E_d$) measured between the drain 122 and channel 126.

Note that the ESD protection structure shown in FIG. 9 need not be an active transistor employed for input or output functions of an IC chip, but may be connected to a bond pad solely for ESD protection. This situation may exist, for example, when an input transistor is designed to be smaller than desirable for ESD protection. In this case, the ESD protection structure of FIG. 9 is bypassed by any signals to or from the bond pad. When an ESD pulse enters the bond pad, however, the structure conducts the current from the pulse into the substrate, averting damage to the IC circuits.

To determine the necessary resistance added via the lightly doped drain 124 of the present invention to ensure that the snapback current spreads before damage occurs, the series resistance ($R_s$) of a localized path conducting current at $I_m$ must be sufficient to cause the voltage of that path to equal or exceed $V_t$. The series resistance ($R_s$) is the sum of the resistance in the channel during snapback conduction (as shown graphically by the upward sloping portion of the curve in FIG. 8) and the resistance of the lightly doped extension of the drain. The resistance in the channel is equal to the channel resistivity during snapback ($\rho_c$) multiplied by the channel length ($L_c$) and divided by the channel area ($A_c$). The channel area ($A_c$) is equal to the channel width (W) times depth (D) and is essentially equal in magnitude to an area ($A_d$) of the extension 124, so that both areas may be termed simply A. The resistance in the lightly doped extension of the drain is equal to the resistivity ($\rho_d$) of that lightly doped region, which can be determined by doping concentrations and doses, multiplied by the lightly doped extent ($E_d$) divided by the extension area (A) orthogonal to the extent ($E_d$). Current limiting each path to less than $I_m$ yields:

$$\frac{V_t - V_H}{R_s} \leq I_m A$$

Substituting for the series resistance ($R_s$):

$$R_s = \rho_c \frac{L_c}{A} + \rho_d \frac{E_d}{A}$$

and solving for ($E_d$) determines the extent ($E_d$) of lightly doped drain extension needed to provide ESD immunity:

$$E_d \geq \frac{V_t - V_H - \rho_c L_c I_m}{I_m \rho_d}$$

In providing this spreading of snapback conduction across the channel, the voltage that occurs must be held below a maximum nondestructive voltage ($V_g$) above which the gate oxide may be destroyed. Thus, an ESD current ($I_{esd}$), which may be 2500 V/1500 Ω or a different selected amperage, multiplied by $R_s$ must be less than or equal to $V_g - V_H$:

$$I_{esd} R_s \leq V_g - V_H$$

or $$A \geq \frac{I_{esd}(\rho_c L_c + \rho_d E_d)}{V_g - V_H}$$

Figure 10:
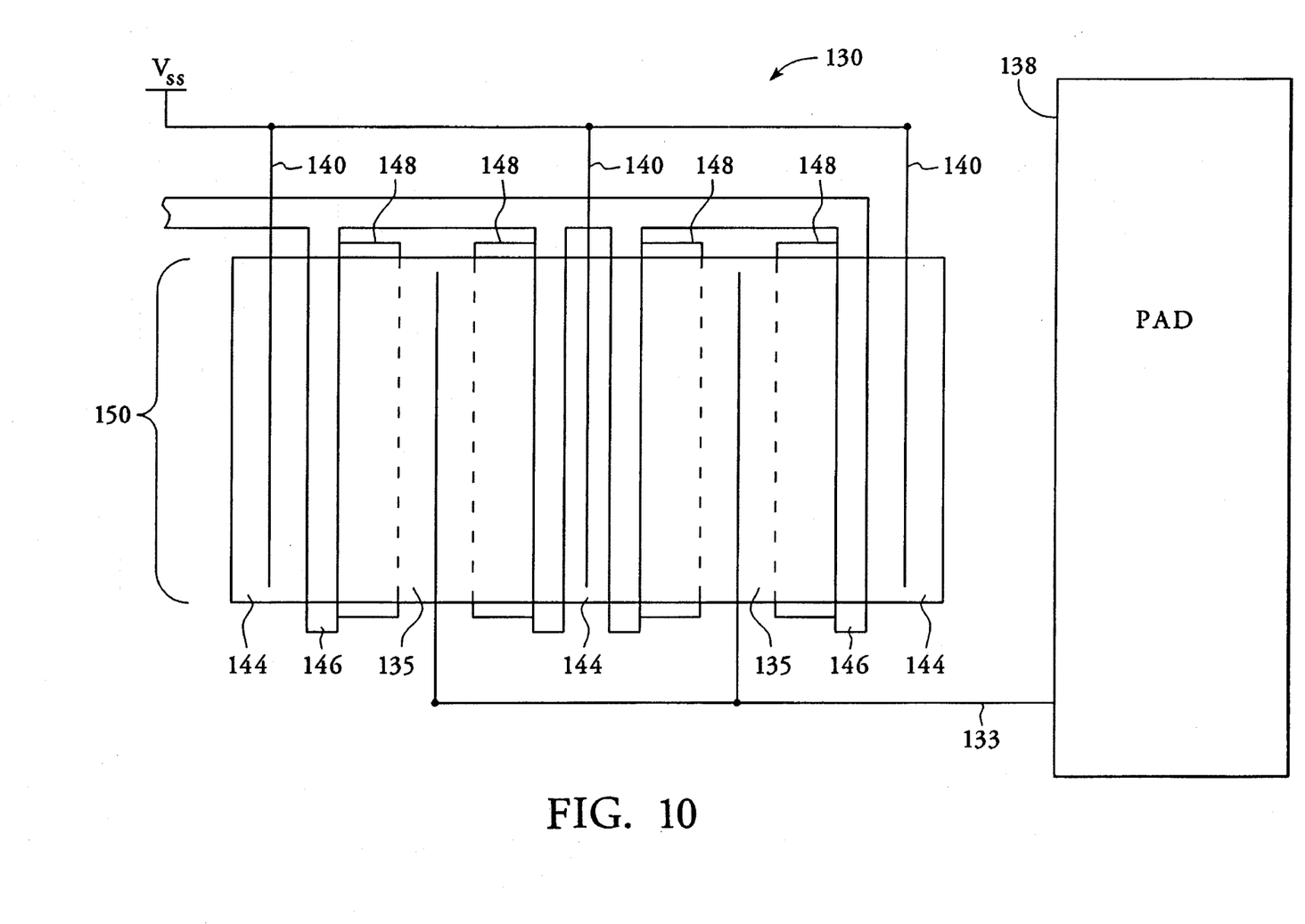
FIG. 10 is a top view of an input/output transceiver of the present invention connected to a bond pad.

With reference to FIG. 10, a top view of an input/output transceiver 130 shows a metal connection 133 between drain regions 135 of the transceiver 130 and an input/output terminal or bond pad 138. Metal connections 140 between source regions 144 and $V_{ss}$ provide a path for an ESD pulse that has traversed the transceiver 130 without damage according to the present invention to be absorbed in a power supply or ground. The dashed rectangles indicate borders of lightly doped drain extensions 148 which terminate near an edge of a polysilicon gate 146. Beneath the gate 146 and between the extensions 148 and the source regions 144 are channels, not shown. Note that the channel width (W) in this interspaced transceiver is four times the width 150 of each individual channel.

The optimal device geometries discussed above can be more conveniently calculated in terms of surface dimensions. For this case, defining $I_{max}$ as the maximum nondestructive snapback current per micron of channel width (W) and $R_{SH}$, as the sheet resistance of the lightly doped region 124, the requirement that the ESD current spread uniformly across the channel not exceed the nondestructive current becomes:

$$W \geq I_{esd}/I_{max}$$

Limiting each current cross-section to $I_{max}$ or less results in a lightly doped drain extent of:

$$E_d \geq \frac{(V_t - V_H) - I_{max}\rho_c}{I_{max} R_{SH}}$$

Providing enough width to keep the voltage drop across the series resistance $R_s$ below the maximum nondestructive gate voltage $V_g$ can be written:

$$W \geq I_{esd}[\rho_c + R_{SH} E_d]/[V_g - V_H]$$

The doping of the lightly doped drain regions may be adjusted during device formation to produce a concentration of between $1 \times 10^{17}$ and $5 \times 10^{19}$ ions/cm$^3$, or a sheet resistance of 100–5,000 Ohms/square. The width (W) of the channel may be in a range between less than 100 to greater than 300 microns, while the length ($L_c$) of the channel may be on the order of one micron to induce snapback conduction. The extent ($E_d$) of the lightly doped drain extension may be between 0.3 micron and 6.0 microns, and preferably around 0.5 micron to 2.0 microns and at least as large as the channel length ($L_c$).

We claim:

1. An electrostatic discharge protection device for an integrated circuit chip comprising:

a semiconductor substrate with a terminal for communication external to the substrate disposed thereon, a discharge structure disposed in said substrate having heavily doped regions of a first conductivity type forming a source and a drain with a channel of a second conductivity type disposed therebetween, said drain connected to said terminal and said source disposed distal to said terminal, said structure being characterized by a trigger voltage above which snapback conduction along a path between said source and said drain is initiated, a holding voltage above which said snapback conduction is sustained, and a maximum nondestructive current density along said path, a lightly doped region of said first conductivity type forming a drain extension separating said drain and said channel and having a resistance in series with said path such that a flow of said maximum nondestructive current density along said path creates a voltage between said source and said drain along said path exceeding said trigger voltage, initiating snapback conduction in an adjacent path between said source and said drain.

2. The device of claim 1 wherein said maximum nondestructive current density integrated over an area of said channel traversed by said paths is greater than a current through said terminal from an electrostatic discharge event.

3. The device of claim 1 wherein said channel is characterized by a channel resistivity ($\rho_c$) during said snapback conduction and has a length ($L_c$) separating said source and said drain extension, wherein said drain extension is characterized by a resistivity ($\rho_d$) and has an extent ($E_d$) separating said drain from said channel, and $$E_d \geq [V_t - V_H - I_m \rho_c L_c]/I_m \rho \rho_d$$

wherein $V_t$ is said trigger voltage, $V_H$ is said holding voltage and $I_m$ is said maximum current density.

4. The device of claim 1 and further comprising a gate separated from said channel by a gate oxide characterized by a maximum nondestructive voltage, wherein a difference between said maximum nondestructive gate oxide voltage and said holding voltage is greater than a difference in voltage between said source and said drain along said paths of an electrostatic discharge current multiplied by a resistance along said paths and divided by a difference between said trigger voltage and said holding voltage.

5. The device of claim 1 wherein said channel has a generally orthogonally related length, width and depth, said length separating said source and said drain extension and said depth encompassing a flow of said snapback current measured from a surface of said substrate, said width being many times larger than said length and said depth, and wherein a current from an electrostatic discharge event is less than said maximum nondestructive current density integrated over said width and said depth.

6. The device of claim 1 wherein said structure comprises an input/output transceiver.

7. The device of claim 1 wherein said structure comprises an output buffer.

8. The device of claim 1 wherein said structure comprises an input buffer.

9. The device of claim 1 and further comprising a gate separated from said channel by a gate oxide, wherein said drain extension has an extent between said drain and said channel that is greater than a height of a top of said gate from said channel.

10. The device of claim 1 wherein said drain extension has an extent between said drain and said channel at least as large as a length of said channel between said source and said drain extension.

11. The device of claim 1 wherein said drain extension has an extent between said drain and said channel that is greater than three-tenths of a micron and less than six microns.

12. The device of claim 1 wherein said drain extension has a doping concentration in a range between $10^{17}$ ions/cm$^3$ and $5 \times 10^{19}$ ions/cm$^3$.

13. An electrostatic discharge tolerant device for communication between an integrated circuit chip and a circuit external to the chip comprising:

a semiconductor chip with a surface having a bond pad disposed thereon, a transistor having heavily doped subsurface source and drain regions separated by a channel region, with a gate disposed over said channel region and separated from said surface by a gate oxide layer, said drain region connected with said bond pad, a lightly doped drain extension disposed between said channel and said drain region, a path between said source region and said drain region characterized by a trigger voltage initiating snapback conduction across said channel, a holding voltage sustaining said snapback conduction and a maximum nondestructive current density, wherein said drain extension has a resistance in series with said path such that a flow of said maximum nondestructive current density along said path raises a voltage of said path above said trigger voltage, thereby initiating snapback conduction in an adjacent path.

14. The device of claim 13 wherein said channel has a length oriented along said paths and a width oriented transversely to said paths, said width being many times larger than said length such that an electrostatic discharge current distributed uniformly across said width has a current density less than said maximum nondestructive current density.

15. The device of claim 14 wherein said drain extension has an extent ($E_d$) oriented along said paths, and $$E_d \geq [V_t - V_H - I_{max} \rho_c]/I_{max} R_d$$

wherein $V_t$ is said trigger voltage, $V_H$ is said holding voltage, $I_{max}$ is a maximum current per unit width and is equal to said maximum nondestructive current density multiplied by a depth of said channel, $\rho_c$ is a resistivity of said channel during said snapback conduction and $R_d$ is a sheet resistance of said drain extension.

16. The device of claim 14 wherein said gate oxide layer is characterized by a maximum nondestructive voltage ($V_g$), and $$W \geq I_{esd}[\rho_c + R_d E_d]/[V_g - V_H]$$

wherein W is said width of said channel, $I_{esd}$ is said electrostatic discharge current, $\rho_c$ is a resistivity of said channel during said snapback conduction, $R_d$ is a sheet resistance of said drain extension, $E_d$ is an extent of said drain extension along said paths and $V_H$ is said holding voltage.

17. The device of claim 13 and further comprising a sidewall oxide layer adjoining said gate and said drain extension, said sidewall oxide layer extending along said surface a distance from said gate oxide greater than a height of a top of said gate from said surface.

18. The device of claim 13 wherein said drain extension has an extent along said paths greater than 0.4 microns and less than 3.0 microns.

19. The device of claim 13 wherein said drain extension has a sheet resistance in a range between 100 and 5,000 Ohms/square.

20. An input/output device for transmitting signals between an integrated circuit chip and a circuit external to the chip comprising:

a semiconductor substrate having a surface and a bond pad adjacent to said surface for communication between a circuit of said substrate and a circuit external to said substrate, an active region of said substrate having doped sections near said surface forming a source and a drain of a first conductivity type separated by a channel of a second conductivity type, said drain connected to said bond pad, a gate having a bottom disposed adjacent to said channel and separated from said surface by a gate oxide layer, said gate having a top distal to said surface, a drain sidewall oxide layer disposed on said surface adjacent to said gate oxide layer and said drain and extending a distance along said surface away from said gate that is greater than a height of said top of said gate from said surface, a lightly doped extension of said drain adjoining said drain sidewall oxide layer and said channel along said distance.

21. The device of claim 20 and further comprising:

a source sidewall oxide layer disposed on said surface adjacent to said gate oxide layer and said source and extending along said surface away from said gate a span that is greater than said height of said top of said gate from said surface, and a lightly doped portion of said source adjoining said source sidewall oxide layer and said channel along said width and said span.

22. The device of claim 20 wherein said channel is characterized by a maximum nondestructive current density and said lightly doped portion of said drain spreads snapback current along a width and depth of said channel, and wherein an area formed by said width multiplied by said depth is greater than an electrostatic current pulse divided by said maximum nondestructive current density.

23. The device of claim 20 being characterized by a trigger voltage above which snapback conduction along a path between said source and said drain is initiated, a holding voltage above which said snapback conduction is sustained, and a maximum nondestructive current density along said path, wherein said drain extension separating said drain and said channel has a resistance in series with said path such that a flow of said maximum nondestructive current density along said path creates a voltage over said path exceeding said trigger voltage, initiating snapback conduction in an adjacent path between said source and said drain.

24. The device of claim 23 wherein said gate oxide layer is characterized by a maximum nondestructive voltage that is greater than said trigger voltage.

\* \* \* \* \*